United States Patent
Li et al.

(10) Patent No.: US 10,802,188 B2
(45) Date of Patent: Oct. 13, 2020

(54) POLARIZER, DISPLAY PANEL AND DISPLAY DEVICE

(71) Applicants: CHENGDU BOE OPTOELECTRONICS TECHNOLOGY CO., LTD., Chengdu, Sichuan (CN); BOE TECHNOLOGY GROUP CO., LTD., Beijing (CN)

(72) Inventors: Zeyu Li, Beijing (CN); Xiaolong Zhu, Beijing (CN); Zhenli Zhou, Beijing (CN); Ting Wang, Beijing (CN); Zhiliang Jiang, Beijing (CN)

(73) Assignees: CHENGDU BOE OPTOELECTRONICS TECHNOLOGY CO., LTD., Chengdu, Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/400,210

(22) Filed: May 1, 2019

(65) Prior Publication Data

US 2020/0018880 A1    Jan. 16, 2020

(30) Foreign Application Priority Data

Jul. 11, 2018   (CN) ............. 2018 1 0759878

(51) Int. Cl.
    G02B 5/30   (2006.01)
    H05K 1/02   (2006.01)
    H05K 5/00   (2006.01)

(52) U.S. Cl.
    CPC ........... *G02B 5/3025* (2013.01); *H05K 1/028* (2013.01); *H05K 5/0017* (2013.01)

(58) Field of Classification Search
    None
    See application file for complete search history.

(56) References Cited

U.S. PATENT DOCUMENTS

| | | | |
|---|---|---|---|
| 2014/0192279 A1* | 7/2014 | Akanuma ........... H04M 1/0266 349/12 |
| 2016/0306224 A1* | 10/2016 | Ishikawa ........... G02F 1/133512 |
| 2018/0182820 A1* | 6/2018 | Kim ...................... H01L 27/323 |
| 2019/0265823 A1* | 8/2019 | Luo ....................... G02B 5/3025 |
| 2019/0332200 A1* | 10/2019 | Lee ........................ G06F 3/044 |
| 2019/0332211 A1* | 10/2019 | Jeon ...................... G06F 3/0488 |
| 2020/0075880 A1* | 3/2020 | Wen ...................... H01L 27/323 |
| 2020/0092997 A1* | 3/2020 | Song ..................... H05K 3/361 |

* cited by examiner

Primary Examiner — Britt D Hanley

(57) ABSTRACT

A polarizer, a display panel and a display device are disclosed. The polarizer includes a view area (VA) and a peripheral area. A notch is disposed in the peripheral area. A side of the notch away from the view area is configured to place a circuit board.

16 Claims, 2 Drawing Sheets

POLARIZER, DISPLAY PANEL AND DISPLAY DEVICE

The present application claims priority of China Patent application No. 201810759878.1 filed on Jul. 11, 2018, the content of which is incorporated in its entirety as portion of the present application by reference herein.

TECHNICAL FIELD

Embodiments of the present disclosure provide a polarizer, a display panel and a display device.

BACKGROUND

With the continuous development of display technology, organic light emitting diode (OLED) display device has become the mainstream of the display field due to the advantages of self-luminescence, bright colors, low power consumption and wide viewing angle, and has gradually become the research hotspot of major manufacturers.

SUMMARY

At least one embodiment of the present disclosure provides a polarizer, which includes a view area and a peripheral area, a notch is disposed in the peripheral area, and a side of the notch away from the view area is configured to place a circuit board.

For example, in the polarizer provided by an embodiment of the present disclosure, the notch and a boundary of the view area close to the notch have a gap therebetween.

For example, in the polarizer provided by an embodiment of the present disclosure, the notch is a first through hole having a strip shape.

For example, in the polarizer provided by an embodiment of the present disclosure, an extending direction of the first through hole in a plane where the polarizer is located is parallel to a boundary of the view area close to the notch.

For example, in the polarizer provided by an embodiment of the present disclosure, the notch includes a plurality of second through holes which are alternately arranged.

For example, in the polarizer provided by an embodiment of the present disclosure, an arrangement direction of the plurality of second through holes is parallel to a boundary of the view area close to the notch.

For example, in the polarizer provided by an embodiment of the present disclosure, pore diameters of the plurality of second through holes are the same, and gaps between two adjacent ones of the plurality of second through holes are equal.

For example, in the polarizer provided by an embodiment of the present disclosure, a cross-sectional shape of each of the plurality of second through holes includes rectangle.

At least one embodiment of the present disclosure provides a display panel, which includes the abovementioned polarizer; a functional layer; and a circuit board, the circuit board is at least partially disposed between the polarizer and the functional layer, electrically connected with the functional layer, and disposed on a side of the notch away from the view area.

For example, in the display panel provided by an embodiment of the present disclosure, the polarizer is partially attached to the functional layer and includes a contact surface; a first edge of the circuit board close to the notch is opposite to a boundary of the view area close to the notch; and the notch is disposed between the first edge and the boundary of the view area close to the notch.

For example, in the display panel provided by an embodiment of the present disclosure, the peripheral area includes a raised area covering the circuit board; two sides of the raised area along an extending direction of the first edge are respectively contacted to a first position and a second position of the functional layer; the peripheral area includes a first area disposed on a side of the first position away from the second position and a second area disposed on a side of the second position away from the first position; and the notch extends from the first area to the second area.

For example, in the display panel provided by an embodiment of the present disclosure, two ends of the notch are respectively disposed in the first area and the second area.

For example, in the display panel provided by an embodiment of the present disclosure, the functional layer includes a touch sensor; and the circuit board is configured to drive the touch sensor.

For example, in the display panel provided by an embodiment of the present disclosure, an extending direction of the notch is parallel to the first edge.

For example, in the display panel provided by an embodiment of the present disclosure, a side wall of the notch close to the first edge is flush with the first edge.

For example, in the display panel provided by an embodiment of the present disclosure, the circuit board includes a flexible printed circuit board.

At least one embodiment of the present disclosure provides a display device, which includes the abovementioned display panel.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the invention apparent, technical solutions according to the embodiments of the present disclosure will be described clearly and completely as below in conjunction with the accompanying drawings of embodiments of the present disclosure. It is to be understood that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly.

Currently, in the module (MDL) process of flexible OLED panels, a bonding area of a polarizer (POL) has to be arranged on a touch sensor.

Figure 1:
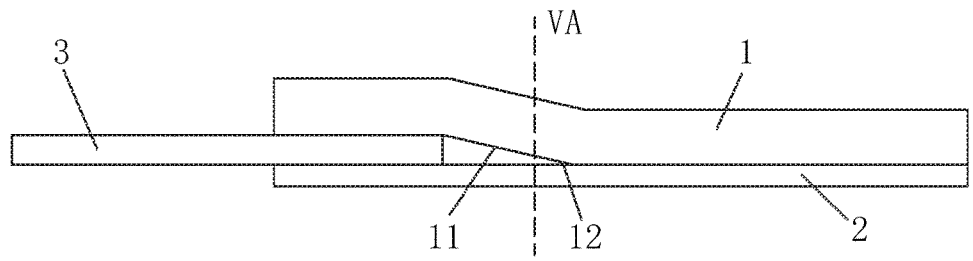
FIG. 1 is a schematic structural view of a polarizer in an attached state.

For example, as illustrated by FIG. 1, a bonding area of a polarizer 1 includes a view area (VA) and a peripheral area. The view area is attached to a touch sensor 2. A flexible printed circuit board (FPCB) 3 is disposed between the peripheral area and the touch sensor 2. In this case, an attaching surface between the polarizer 1 and the touch sensor 2 has a height difference compared with a contact surface between the polarizer 1 and the flexible printed circuit board 3, so that the polarizer 1 can produce an inclined slope 11 extending from the contact surface to the attaching surface, and a bubble 12 can be easily generated in a gap between the inclined slope 11 and the flexible printed circuit board 3. Because the peripheral area of the polarizer 1 is relatively narrow, the inclined slope 11 will extend into the view area, so the bubble 12 can extend into the view area, resulting in undesirable phenomena such as visible bubble and light leakage. In another aspect, upon pressure intensity, temperature and humidity of the environment of the flexible OLED panel changing, the volume of the bubble 12 will change, so that the bubble can extend into the view area, resulting in the undesirable phenomena such as visible bubble and light leakage.

Figure 2:
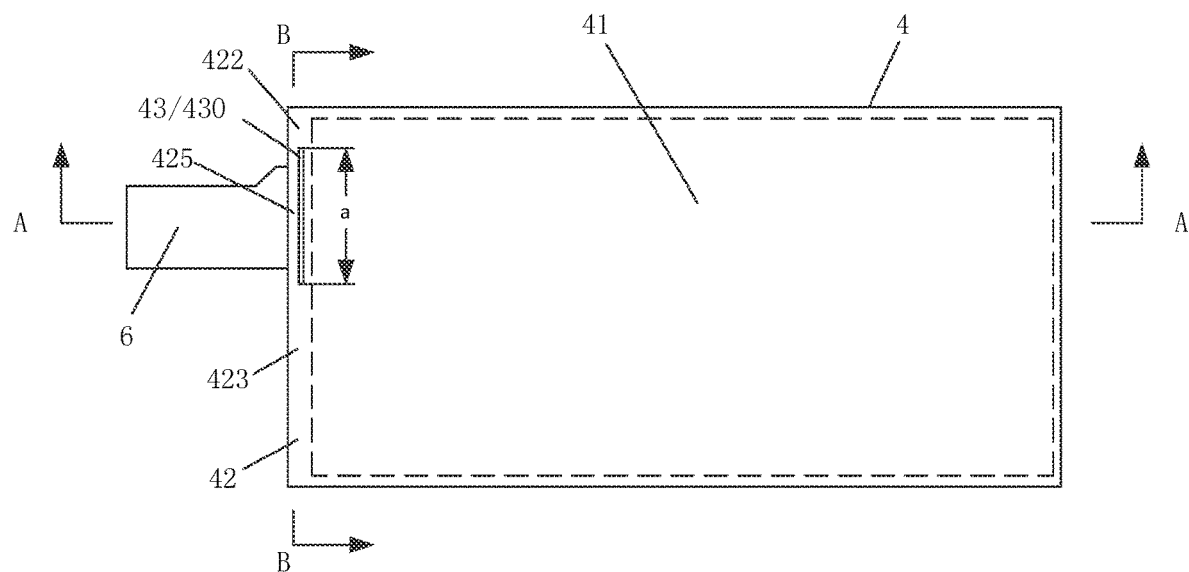
FIG. 2 is a schematic structural view of a polarizer provided by an embodiment of the present disclosure in an attached state.
Figure 3:
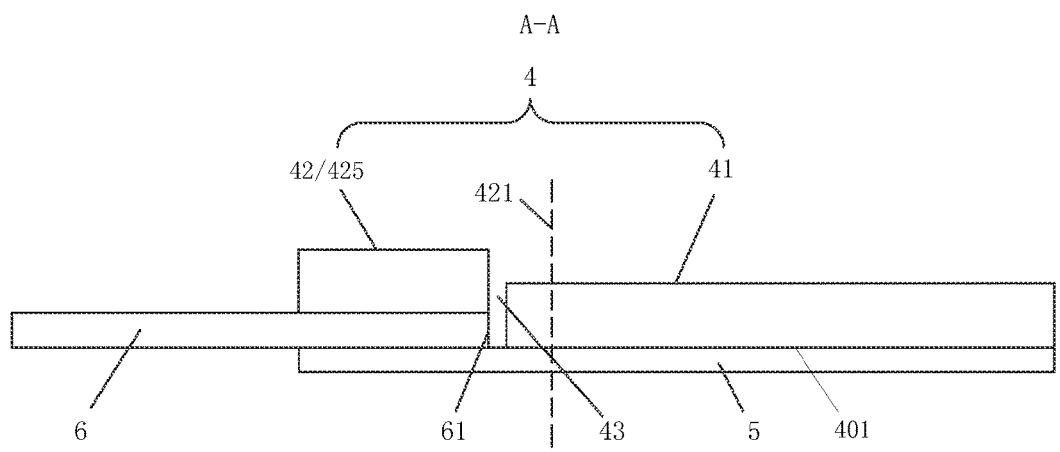
FIG. 3 is a sectional view along A-A in FIG. 2.
Figure 4:
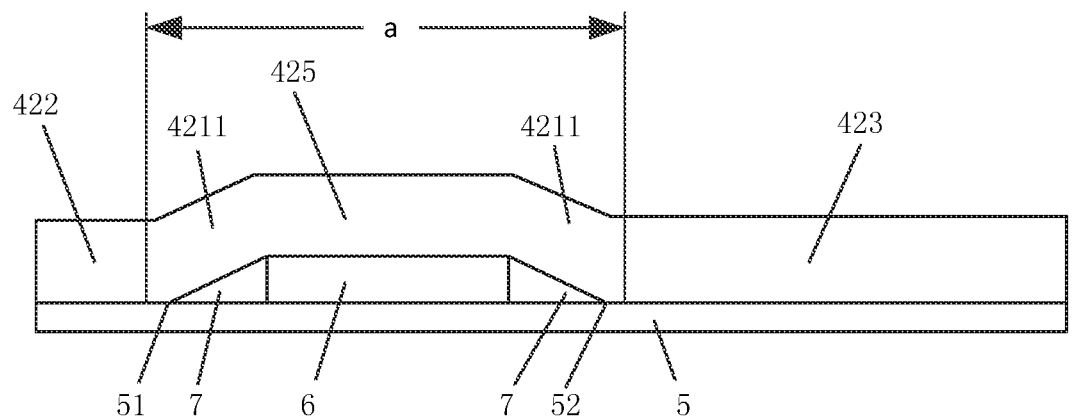
FIG. 4 is a sectional view along B-B in FIG. 2.

At least one embodiment of the present disclosure provides a polarizer. FIG. 2 is a schematic structural view of a polarizer provided by an embodiment of the present disclosure in an attached state. FIG. 3 is a sectional view along A-A in FIG. 2. FIG. 4 is a sectional view along B-B in FIG. 2.

As illustrated by FIG. 2, the polarizer 4 includes a view area 41 and a peripheral area 42; a notch 43 is disposed in the peripheral area 42; and a side of the notch 43 away from the view area 41 is configured to place a circuit board. Thus, upon the polarizer being attached to a functional layer (e.g., a touch sensor) which has to be driven by a circuit board, the circuit board can be disposed on a side of the notch 43 away from the view area 41, so as to avoid the bubble generated between the polarizer and the functional layer due to the circuit board, thereby avoiding the undesirable phenomena such as visible bubble and light leakage.

Hereinafter, the structure and the functions of the polarizer provided by the embodiments of the present disclosure by taking a case where the functional layer is a touch sensor as an example.

For example, as illustrated by FIGS. 2 to 4, upon the polarizer 4 is attached to a touch sensor 5 and has an attaching surface 401, a first edge 61 of a circuit board 6 arranged on the touch sensor 5 is located in the peripheral area 42 and opposite to a second edge 421 of the peripheral area 42; the circuit board 6 is disposed between the polarizer 4 and the touch sensor 5; and the first edge 61 of the circuit board 6 close to the notch 43 is disposed in the peripheral area 42 and opposite to a boundary of the view area 41 (namely the second side 421 of the peripheral area 42). In this case, the notch 43 isolates the circuit board 6 and the view area 41, which can avoid the bubble generated between the polarizer and the functional layer due to the circuit board on one hand, and on the other hand, can also prevent the bubble from extending into the view area, thereby effectively avoiding the undesirable phenomena such as visible bubble and the light leakage. It should be noted that the notch may be a continuous through hole having a strip shape and may also be a plurality of through holes which are alternately arranged. Upon the notch being a plurality of through holes which are alternately arranged, the plurality of through holes which are alternately arranged may also play a role in communicating with the outside world, so as to avoid the bubble generated between the polarizer and the functional layer due to the circuit board. For example, upon pressure intensity, temperature and humidity of the environment of the flexible OLED panel changing, the plurality of through holes which are alternately arranged can avoid the deformation of the notch or the gas under the notch due to expansion.

For example, as illustrated by FIGS. 2-4, the peripheral area 42 includes a raised area 425 covering the circuit board 6; two sides of the raised area 425 along a direction of the first edge 61 are respectively contacted to a first position 51 and a second position 52 of the touch sensor 5; the peripheral area 42 includes a first area 422 disposed on a side of the first position 51 away from the second position 52 and a second area 423 disposed on a side of the second position 52 away from the first position 51; and the notch 43 is disposed between the first edge 61 and the second edge 421 and extends from the first area 422 to the second area 423. Thus, the notch can also avoid the bubble in the first area and the second area from extending into the view area.

For example, in some examples, as illustrated by FIG. 4, a length a of the notch 43 is greater than a distance between the first area and the second area, so as to further avoid the bubble in the first area and the second area from extending into the view area.

For example, as illustrated by FIGS. 2-4, a surface of the polarizer 4 is an attaching surface 401. In the module process, the attaching surface 401 of the polarizer 4 is attached to the touch sensor 5. In this case, the peripheral area 42 of the polarizer 4 covers the circuit board 6 of the touch sensor 5, and an area in the polarizer 4 covering the circuit board 6 will be raised. If the notch 43 is not arranged, an inclined slope will be formed between a surface of the polarizer 4 contacting the circuit board 6 and a surface of the polarizer 4 attached to the touch sensor 5. In the embodiment of the present disclosure, the notch 43 is arranged at a position at which the inclined slope will be formed, and the notch 43 is disposed in the peripheral area 42 of the polarizer 4 and will not affect the view area 41; and because the notch 43 extends from the first area 422 to the second area 423, a part of the polarizer from the notch 43 to the view area 41 can be completely attached to the touch sensor 5, thereby avoiding the bubble from entering the view area 41.

It should be noted that the first area 422 and the second area 423 are respectively disposed on two sides of the raised area 425 along the direction of the first edge 61. In the present embodiment, the direction of the first edge 61 is a width direction of the circuit board 6, in which the first area 422 and the second area 423 are parts in the peripheral area 42 that are completely attached to the touch sensor 5; there are two inclined slopes 4211 on both sides of the raised area 425 respectively extending to the first area 422 and the second area 423; and there are two gaps 7 between the inclined slopes 4211 and the touch sensor 5; there are bubbles in the gaps 7; and upon the notch 43 extending from the first area 422 to the second area 423, the notch 43 will isolate the bubbles in the gaps 7 of the raised area 425 from the view area 41, so there is no bubble in the view area 41.

In the polarizer provided by the embodiment of the present disclosure, upon the attaching surface of the polarizer is attached to the touch sensor, partial area of the peripheral area of the polarizer will cover the circuit board of the touch sensor, so this partial area will be raised to form the raised area; because the notch is arranged between the circuit board and the boundary line of the peripheral area and extends from the first area to the second region which are on both sides of the raised area, the notch will isolate the gap of the raised area from extending into the view area, so the bubble located in the raised area will not extend into the view area, thereby avoiding the production of bubble in the view area of the polarizer and avoiding the undesirable phenomena such as visible bubble and light leakage.

For example, two ends of the notch 43 are respectively located in the first area 422 and the second area 423. That is to say, two ends of the notch 43 do not run through the peripheral area 42, namely the view area 41 and the peripheral area 42 are not broken by the notch 43, so the view area 41 is connected with the peripheral area 42. In general, there is pressure sensitive adhesive on the attaching surface of the polarizer 4. Thus, upon the attaching surface of the polarizer 4 being attached to the touch sensor 5, a part of the polarizer 4 covering the circuit board 6 is connected with a part of the polarizer attached to the touch sensor 5, so the pressure sensitive adhesive on the polarizer 4 can adhere and fix the circuit board 6, thereby avoiding the tearing risk of the touch sensor 5 due to the fact that the circuit board 6 is not fixed and can be easily folded. Moreover, the pressure sensitive adhesive on the polarizer 4 is directly utilized for adhesion, and no additional optically clear adhesive (OCA), namely a special adhesive for bonding transparent optical components, is required to be additionally added, so the material costs and the process costs can be saved.

For example, in some examples, the notch 43 and the boundary of the view area 41 close to the notch 43 have a gap therebetween, so as to more effectively avoid the gas from entering the view area 41.

For instance, in some examples, the notch 43 is a first through hole 430 having a strip shape. That is to say, the first through hole is a strip hole, and a processing technology of the strip hole is simple. Thus, compared with the cases of cutting a notch with complex shapes in the polarizer, the costs can be reduced and the production cycle can be shortened.

For example, in some examples, as illustrated by FIG. 2, the extending direction of the first through hole 430 on a plane provided with the polarizer 4 is parallel to the border of the view area 41 close to the notch 43.

Figure 5:
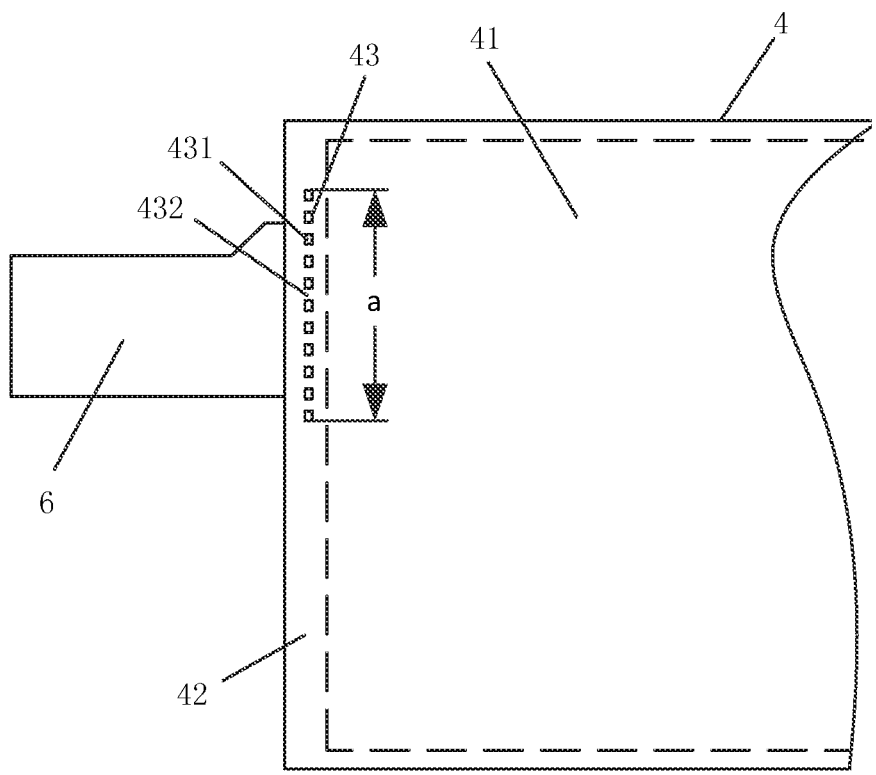
FIG. 5 is a schematic structural view of another polarizer provided by an embodiment of the present disclosure in an attached state.

For example, the first through hole having a strip shape allows the notch 43 to have a solid line structure, or as illustrated by FIG. 5, in another embodiment, the notch 43 can be designed to have a dotted line structure, with details as follows:

For example, the notch 43 includes a plurality of second through holes 431, and the plurality of second through holes 431 are arranged along the extending direction of the notch 43, namely an arrangement direction of the plurality of first through holes 431 is the extending direction of the notch 43, every two adjacent ones of the plurality of second through holes 431 have a gap 432 therebetween. The alternately arranged mode of the plurality of second through holes 431 allows the notch to have a dotted line structure. Compared with the solid line structure, because there is a polarizer part between every two adjacent ones of the plurality of second through holes 431, this dotted line structure is not easy to cause a crack that occurs upon the notch 43 extending, reduces the risk that the notch 43 may have a tearing effect, and then reduces the risk of damaging the polarizer 4. Upon the ambient temperature, the gas pressure and the like changing, the bubble can still be discharged through the second through holes 431 and will not be extended to the view area 41.

For example, in some examples, as illustrated by FIG. 5, the arrangement direction of the plurality of second through holes 431 is parallel to the boundary of the view area 41 close to the notch 43.

For example, the plurality of second through holes 431 are the same, and the gaps 432 between every two adjacent ones of the plurality of second through holes 431 are equal. The shapes and the sizes of the plurality of second through holes 431 are the same. The plurality of second through holes 431 are uniformly arranged, so that the bubble can be discharged from the plurality of second through holes 431 in time and will not retain on the polarizer parts between adjacent ones of the plurality of second through holes 431, thereby effectively avoiding the bubble from extending into the view area 41.

For example, each of the plurality of second through hole 431 is a square hole, namely a cross-sectional shape of the second through hole 431 includes rectangle. Because the peripheral area 42 is relatively narrow, an edge of the square hole may be parallel to the boundary line of the peripheral area 42, so as to leave enough space between the square hole and the boundary line of the peripheral area 42 and avoid the damage of the view area 41 due to the tearing of the notch 43.

For example, as illustrated by FIGS. 2 to 5, the extending direction of the notch 43 is parallel to the first edge 61. Upon the notch 43 being a first through hole having a strip shape, the first through hole is a straight line; a length direction of the first through hole is parallel to the first edge 61 of the circuit board 6; and the first through hole extends to the second area 423 from the first area 422 along a straight line. Thus, the first through hole can be far away from the boundary of the view area 41, thereby avoiding the damage of the view area 41 due to the tearing effect of the first through hole. Upon the notch being a plurality of second through holes 431 which are alternately arranged, the plurality of second through holes 431 are arranged along a straight line; the arrangement direction is parallel to the first edge of the circuit board; and the plurality of second through holes 431 are arranged from the first area to the second area along the straight line. Similarly, the plurality of second through holes 431 can be also far away from the boundary of the view area 41, thereby avoiding the damage of the view area 41 due to the tearing effect of the second through holes 431.

For example, as illustrated by FIG. 3, a side wall of the notch 43 close to the first edge 61 is flush with the first side 61. The notch 43 is close to the first edge 61 of the circuit board 6, which ensures that the notch 43 is far away from the boundary of the view area 41. Moreover, the polarizer 4 can be completely attached to the circuit board 6, and the side wall of the notch 43 will not be suspended between the circuit board 6 and the view area 41, thereby avoiding the case that the polarizer part is suspended between the circuit board 6 and the view area 41 and reducing the tearing damage risk of the polarizer 4.

In the polarizer provided by the embodiment of the present disclosure, upon the attaching surface of the polarizer is attached to the functional layer such as the touch sensor, partial area of the peripheral area of the polarizer will cover the circuit board of the touch sensor, and this partial area will be raised to form the raised area; and the notch is arranged between the circuit board and the boundary of the peripheral area, extends from the first area to the second area which are located on both sides of the raised area, and isolates the gap of the raised area from extending into the view area, so the bubble located in the raised area will not extend into the view area, thereby avoiding the production of bubble in the view area of the polarizer and avoiding the undesirable phenomena such as visible bubble and light leakage. Because two ends of the notch do not run through the peripheral area, namely the view area and the peripheral area are not broken by the notch, the view area is connected with the peripheral area. In general, there is pressure sensitive adhesive on the contact surface of the polarizer. Upon the attaching surface of the polarizer being attached to the touch sensor, the part of the polarizer covering the circuit board is connected with the part attached to the touch sensor, so the pressure sensitive adhesive on the polarizer can adhere and fix the circuit board, thereby avoiding the tearing risk of the touch sensor due to the fact that the circuit board is not fixed and can be easily folded. Moreover, the pressure sensitive adhesive on the polarizer is directly utilized for adhesion, and no OCA, namely a special adhesive for bonding transparent optical components, is required to be additionally added, so the material costs and the process costs can be saved.

For example, an embodiment of the present disclosure further provides a display panel, which comprises the abovementioned polarizer; a functional layer; and a circuit board, the circuit board is at least partially disposed between the polarizer and the functional layer, electrically connected with the functional layer, and disposed on a side of the notch away from the view area.

For example, the functional layer may be a touch sensor; the circuit board is disposed on the touch sensor; the attaching surface of the polarizer is attached to the touch sensor; and the polarizer covers the touch sensor.

In the display panel provided by the embodiment of the present disclosure, the attaching surface of the polarizer is attached to the touch sensor; partial area of the peripheral area of the polarizer covers the circuit board of the touch sensor, and this partial area will be raised to form the raised area; because the notch is arranged between the circuit board and the boundary line of the peripheral area and extends from the first area to the second area which are located on both sides of the raised area, the notch isolates the gap of the raised area from extending into the view area, so the bubble disposed in the raised area will not extend into the view area, thereby avoiding the production of the bubble in the view area of the polarizer and avoiding the undesirable phenomena such as visible bubble and light leakage.

For example, in some examples, the polarizer is partially attached to the functional layer and includes an attaching surface; a first edge of the circuit board close to the notch is opposite to a boundary of the view area close to the notch; and the notch is disposed between the first side and the boundary of the view area close to the notch. In this case, the notch isolates the circuit board from the view area, which can avoid the bubble generated between the polarizer and the functional layer due to the circuit board on one hand, and on the other hand, can also avoid the bubble from extending into the view area, thereby effectively avoiding the undesirable phenomena such as visible bubble and light leakage. More details may refer to relevant description of FIGS. 2-4, so no further description will be given here.

For example, in some examples, the peripheral area includes a raised area covering the circuit board; two sides of the raised area in an extending direction of the first edge are respectively contacted to a first position and a second position of the functional layer; the peripheral area includes a first area disposed on a side of the first position away from the second position and a second area disposed on a side of the second position away from the first position; and the notch extends from the first area to the second area. Thus, the notch can also avoid the bubble in the first area and the second area from extending into the view area. More details may refer to relevant description of FIGS. 2-4, so no further description will be given here.

For example, in some examples, two ends of the notch are respectively disposed in the first area and the second area, so the view area is connected with the peripheral area. In general, there is pressure sensitive adhesive on the contact surface of the polarizer. Upon the attaching surface of the polarizer being attached to the touch sensor, a part of the polarizer covering the circuit board is connected with a part attached to the touch sensor. Thus, the pressure sensitive adhesive on the polarizer can adhere and fix the circuit board, thereby avoiding the tearing risk of the touch sensor due to the fact that the circuit board is not fixed and can be easily folded. Moreover, the pressure sensitive adhesive on the polarizer is directly utilized for bonding, and no OCA, namely a special adhesive for bonding transparent optical components, is required to be additionally added, so the material cost and the process cost can be saved.

For example, in some examples, the functional layer includes a touch sensor, and the circuit board is configured to drive the touch sensor.

For example, in some examples, the extending direction of the notch is parallel to the first edge.

For example, in some examples, a side wall of the notch close to the first side is flush with the first side.

For example, in some examples, the circuit board includes a flexible PCB. Of course, the embodiment of the present disclosure includes but not limited thereto, and the circuit board may also be other circuit boards. The embodiment of the present disclosure further provides a display device, which comprises: the abovementioned display panel. The structure and the principle of the display panel are the same with those in the abovementioned embodiment, so no further description will be given here.

In the display panel of the display device provided by the embodiment of the present disclosure, upon the attaching surface of the polarizer being attached to the touch sensor, partial area of the peripheral area of the polarizer will cover the circuit board of the touch sensor, so this partial area will be raised to form the raised area; because the notch is arranged between the circuit board and the boundary line of the peripheral area and extends from the first area to the second area which are located on both sides of the raised area, the notch will isolate the gap of the raised area from extending into the view area, so the bubble disposed in the raised area will not extend into the view area, thereby avoiding the production of bubble in the view area of the polarizer and avoiding the undesirable phenomena such as visible bubble and light leakage.

The following statements should be noted:

(1) The drawings accompanying the embodiment(s) of the present disclosure involve only the structure(s) in connection with the embodiment(s) of the present disclosure, and other structure(s) can be referred to common design(s).

(2) In case of no conflict, features in an embodiment or in different embodiments of the present disclosure can be combined with each other.

The above are merely specific implementations of the present disclosure without limiting the protection scope of the present disclosure thereto. Within the technical scope revealed in the present disclosure, modification(s) or substitution(s) may be easily conceivable for those skilled who are familiar with the present technical field, and these modification(s) and substitution(s) all should be contained in the protection scope of the present disclosure. Therefore the protection scope of the present disclosure should be based on the protection scope of the appended claims.

What is claimed is:

1. A polarizer, comprising: a view area and a peripheral area,
    wherein a notch is disposed in the peripheral area, and a side of the notch away from the view area is configured to place a circuit board, the notch includes a plurality of second through holes which are alternately arranged.

2. The polarizer according to claim 1, wherein the notch and a boundary of the view area close to the notch have a gap therebetween.

3. The polarizer according to claim 1, wherein the notch is a first through hole having a strip shape.

4. The polarizer according to claim 3, wherein an extending direction of the first through hole in a plane where the polarizer is located is parallel to a boundary of the view area close to the notch.

5. The polarizer according to claim 1, wherein an arrangement direction of the plurality of second through holes is parallel to a boundary of the view area close to the notch.

6. The polarizer according to claim 1, wherein pore diameters of the plurality of second through holes are the same, and gaps between every two adjacent ones of the plurality of second through holes are equal.

7. The polarizer according to claim 1, wherein a cross-sectional shape of each of the plurality of second through holes includes rectangle.

8. A display panel, comprising:
    the polarizer according to claim 1;
    a functional layer; and
    the circuit board,
    wherein the circuit board is at least partially disposed between the polarizer and the functional layer, electrically connected with the functional layer, and disposed on a side of the notch away from the view area.

9. The display panel according to claim 8, wherein the polarizer is partially attached to the functional layer and includes an attaching surface; a first edge of the circuit board close to the notch is opposite to a boundary of the view area close to the notch; and the notch is disposed between the first edge and the boundary of the view area close to the notch.

10. The display panel according to claim 9, wherein the peripheral area includes a raised area covering the circuit board; two sides of the raised area along an extending direction of the first edge are respectively contacted to a first position and a second position of the functional layer; the peripheral area includes a first area disposed on a side of the first position away from the second position and a second area disposed on a side of the second position away from the first position; and the notch extends from the first area to the second area.

11. The display panel according to claim 10, wherein two ends of the notch are respectively disposed in the first area and the second area.

12. The display panel according to claim 8, wherein the functional layer includes a touch sensor; and the circuit board is configured to drive the touch sensor.

13. The display panel according to claim 12, wherein an extending direction of the notch is parallel to the first edge.

14. The display panel according to claim 13, wherein a side wall of the notch close to the first edge is flush with the first edge.

15. The display panel according to claim 8, wherein the circuit board includes a flexible printed circuit board.

16. A display device, comprising: the display panel according to claim 8.

* * * * *